United States Patent
Ma

(10) Patent No.: US 9,258,881 B2
(45) Date of Patent: Feb. 9, 2016

(54) SMT HEAT SINK ANCHOR

(71) Applicant: HON HAI PRECISION INDUSTRY CO., LTD., New Taipei (TW)

(72) Inventor: Hao-Yun Ma, San Jose, CA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 193 days.

(21) Appl. No.: 14/161,618

(22) Filed: Jan. 22, 2014

(65) Prior Publication Data

US 2015/0208495 A1    Jul. 23, 2015

(51) Int. Cl.
*H01L 23/40* (2006.01)
*H05K 7/20* (2006.01)
*H05K 1/02* (2006.01)
*H01L 23/34* (2006.01)
*H05K 3/30* (2006.01)

(52) U.S. Cl.
CPC .............. *H05K 1/0203* (2013.01); *H01L 23/34* (2013.01); *H01L 23/40* (2013.01); *H05K 3/301* (2013.01); *H05K 2201/066* (2013.01); *H05K 2201/10393* (2013.01); *H05K 2201/2045* (2013.01); *H05K 2201/2072* (2013.01)

(58) Field of Classification Search
CPC .............. H01L 23/40–23/4006; H05K 1/0203
See application file for complete search history.

(56) References Cited

U.S. PATENT DOCUMENTS

| | | | | |
|---|---|---|---|---|
| 5,734,556 A * | 3/1998 | Saneinejad | ......... | H01L 23/4093 24/598.1 |
| 6,222,734 B1 * | 4/2001 | Bookhardt | .......... | H01L 23/4093 24/458 |
| 6,822,867 B2 * | 11/2004 | Hsieh | ...................... | H01L 23/40 165/185 |
| 7,167,369 B1 * | 1/2007 | Huynh | ................ | H01L 23/4093 165/80.3 |
| 7,183,496 B2 * | 2/2007 | Arrigotti | ............. | H01L 23/4093 174/260 |
| 7,333,335 B2 * | 2/2008 | Hsieh | ...................... | H01L 23/40 257/E23.083 |
| 7,595,991 B2 * | 9/2009 | Hsieh | ...................... | H01L 23/40 165/185 |
| 7,885,077 B2 * | 2/2011 | Sass | .................... | H01L 23/4093 174/260 |
| 8,139,361 B2 * | 3/2012 | Hager | .................... | H05K 3/308 174/260 |
| 8,482,923 B2 * | 7/2013 | Tan | ..................... | H01L 23/4093 165/104.33 |

FOREIGN PATENT DOCUMENTS

JP     05082999 A  *  4/1993
WO    03003455      1/2003

* cited by examiner

*Primary Examiner* — Robert J Hoffberg
(74) *Attorney, Agent, or Firm* — Wei Te Chung; Ming Chieh Chang

(57) ABSTRACT

An electronic device includes a printed circuit board having a top surface, a clip member, a heat sink mounted on the top surface of the printed circuit board, and an anchor having a mounting portion with a solder surface for soldering to the top surface of the printed circuit board and a hook portion used to lock the clip member assembled to the heat sink. The solder surface is mounted to the top surface of the printed circuit board by surface mount technique (SMT).

13 Claims, 5 Drawing Sheets

SMT HEAT SINK ANCHOR

BACKGROUND OF THE INVENTION

1. Field of the Invention

The present invention relates to a heat sink anchor, and more particularly to a heat sink anchor fixed to a printed circuit board by surface mount technique.

2. Description of Related Art

WO Publication No. 2003003455 issued to George on Jan. 9, 2003 discloses heat sink components to be coupled with a printed circuit board. The heat sink components include a thermal conductive plate and at least two mounting pins. The thermal conductive plate can further include a heat exchange portion disposed across the mounting pins. The mounting pins are inserted into corresponding holes of the printed circuit board so that the mounting pins can be wave soldered to the printed circuit board. The heat sink components are most of the time too heavy to be held by only mounting pins during shock and vibration tests, because the inner side of the hole provides less solder surface to engage with the mounting pin.

Therefore, an improved heat sink component is needed.

SUMMARY OF THE INVENTION

An object of the present invention is to provide a heat sink anchor fixed to a printed circuit board by surface mount technique such that enough retention force can be provided between the heat sink anchor and the printed circuit board.

According to one aspect of the present invention, an electronic device comprises a printed circuit board having a top surface, a clip member, a heat sink mounted on the top surface of the printed circuit board, and an anchor having a mounting portion with a solder surface for soldering to the top surface of the printed circuit board and a hook portion used to lock the clip member assembled to the heat sink. The solder surface is mounted to the top surface of the printed circuit board by surface mount technique (SMT).

According to another aspect of the present invention, an anchor assembled to a printed circuit board used to hook a corresponding member comprises a retention member and a location member. The retention member includes a mounting portion extending substantially along a top surface of the printed circuit board and a hook portion extending upwardly from the mounting portion. The location member includes a post with one end connected with the retention member and the other end positioning in a hole of the printed circuit board. Wherein, a solder surface defined at bottom surface of the mounting portion is fixed to the top surface of the printed circuit board by surface mount technique (SMT).

Other objects, advantages and novel features of the invention will become more apparent from the following detailed description of a preferred embodiment when taken in conjunction with the accompanying drawings.

DETAILED DESCRIPTION OF THE INVENTION

Figure 1:
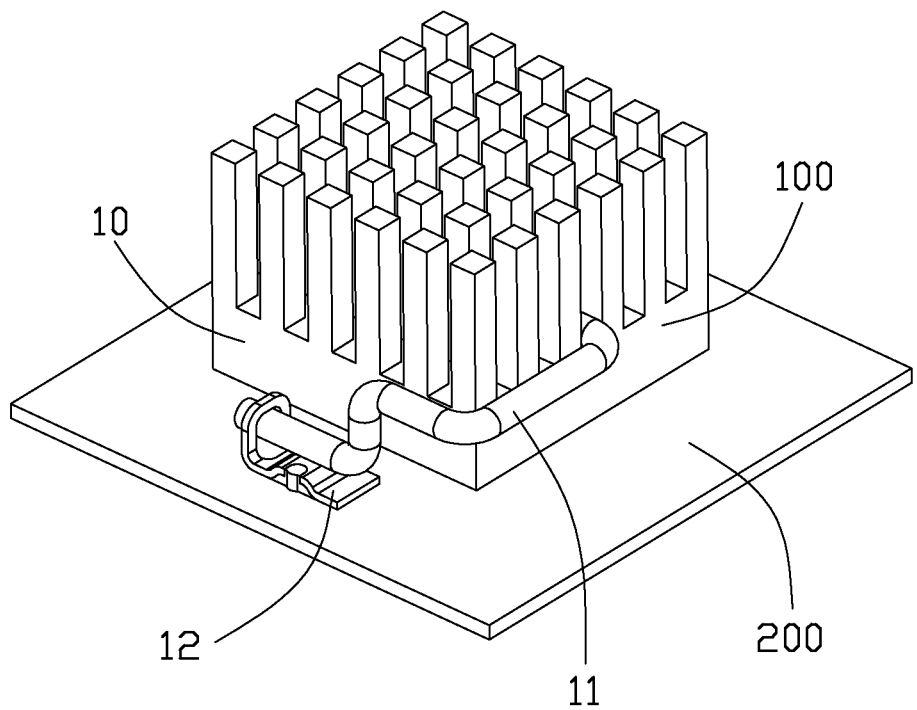
FIG. 1 is an assembled, perspective view of a heat sink component mounted on a printed circuit board in accordance with the present invention.
Figure 2:
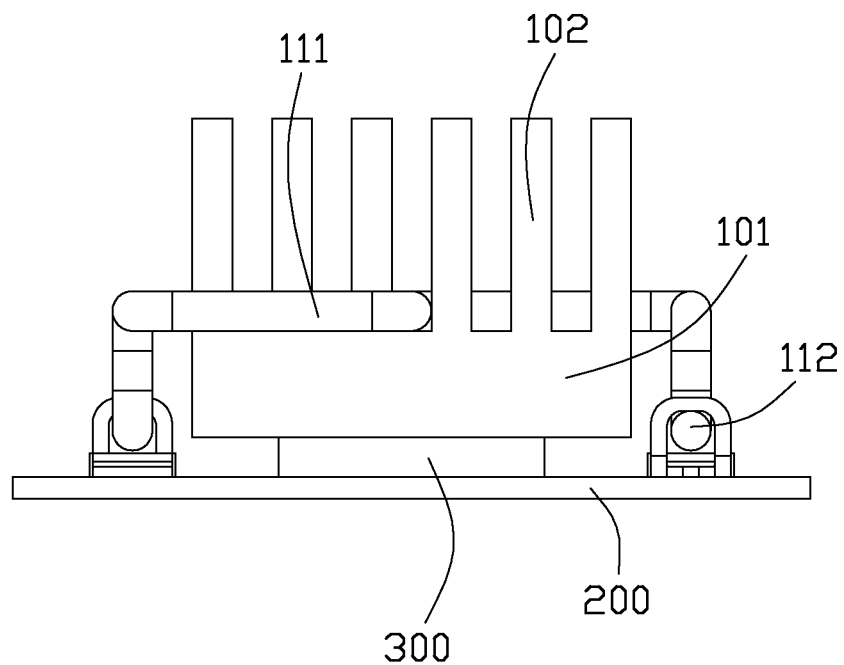
FIG. 2 is a side view of the heat component and the printed circuit board shown in FIG. 1.

FIG. 1 and FIG. 2 show a heat sink component 100 mounted on a printed circuit board 200 to dissipate heat produced by an electronic package unit 300 mounted upon the top surface of the printed circuit board 200. The heat sink component 100 includes a heat sink 10, a clip member 11, and an anchor 12.

The heat sink 10 includes thermally conductive plate 101 seated upon the electronic package unit 300, and a heat exchange portion 102 having a plurality of fins extending upwardly from the thermally conductive plate 101.

Figure 3:
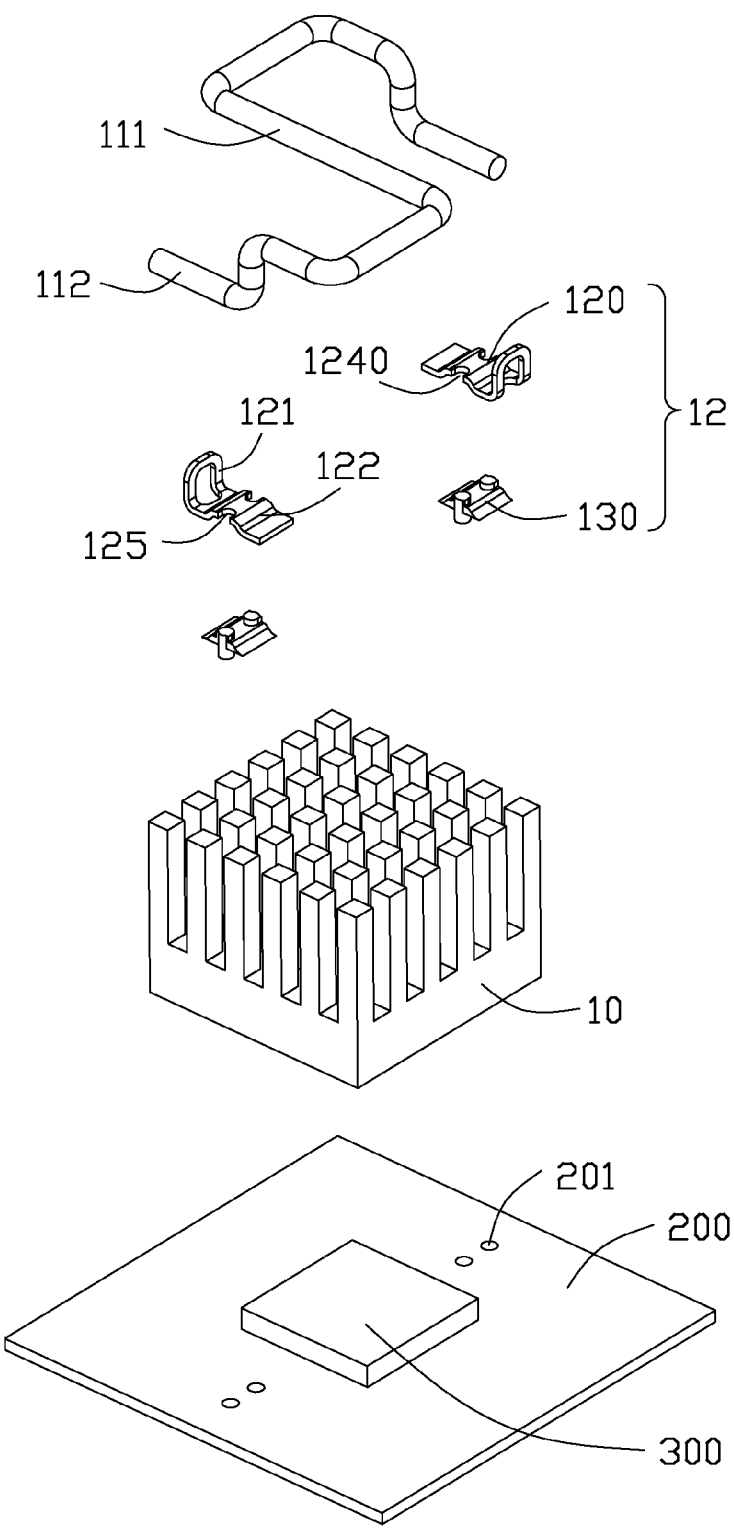
FIG. 3 is an exposed, perspective view of the heat sink component of the present invention shown in FIG. 1.

Referring to FIG. 3, the clip member 11 in this embodiment is a clipping lever. The clipping lever includes a pressing portion 111 and a locking portion 112. The pressing portion 111 is disposed on an upper surface of the thermally conductive plate 101 and among the fins of the heat exchange portion 102. The locking portion 112 is bent downwardly from the pressing portion 111 and used to be locked by the anchor 12. The clip member 11 also can be a slip or other structures.

Figure 4:
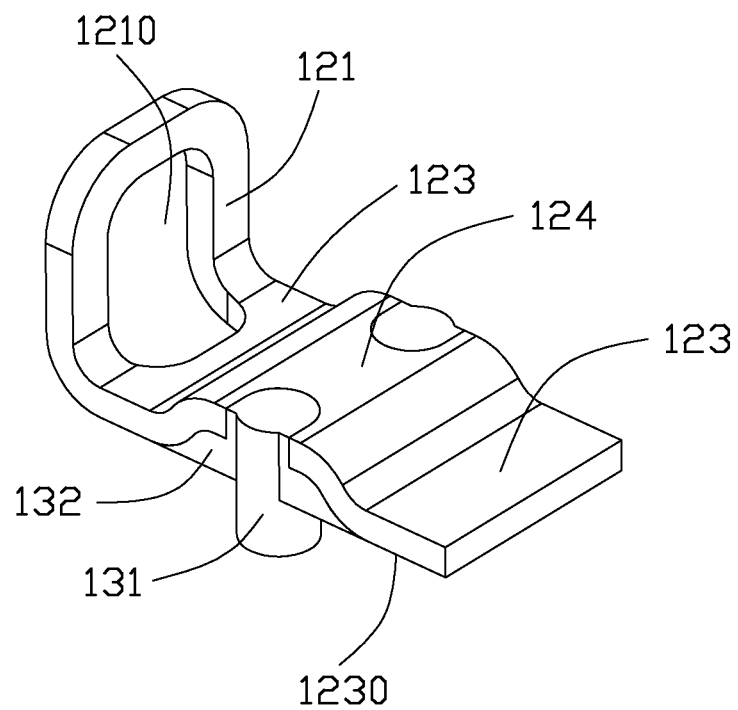
FIG. 4 is a perspective view of the heat sink anchor.

Referring to FIG. 3 and FIG. 4, the anchor 12 comprises a retention member 120 and a location member 130. The retention member 120 includes a hook anchor 121 extending in a vertical direction and a mounting portion 122 substantially extending in a horizontally direction. The hook anchor 121 defines an opening 1210 to receive and lock the locking portion 112. The mounting portion 122 includes two solder portions 123 with two solder surfaces 1230 at bottom surface thereof adapt for soldering to the printed circuit board 200 by surface mount technique (SMT). A protrusion portion 124 connects the two solder portions 123 and is higher than the solder portions 123 to support the locking portion 112. An accommodating room 1240 is formed at bottom of the protrusion portion 124 to receive the location member 130. The protrusion portion 124 defines two cutouts 125 at two sides thereof.

Figure 5:
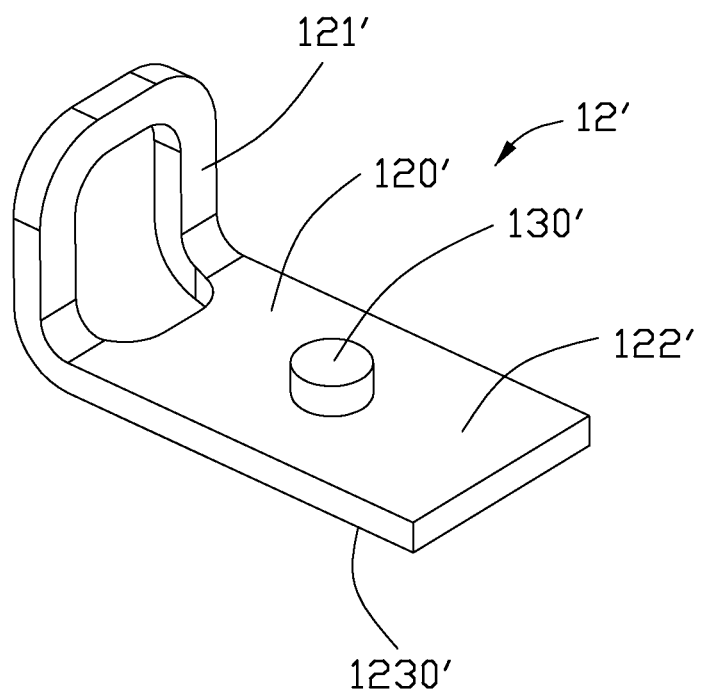
FIG. 5 is a perspective view of an alternative heat sink anchor.

The location member 130 is made of plastic material. The location member 130 includes two posts 131 and a flange 132 disposed around the posts 131. The flange 132 is substantially disposed in a middle position of the posts 131 in the vertical direction and the two ends of each post 131 are exposed out of the flange 132. Wherein one end of the post 131 is assembled in the cutout 125 and the other end is assembled in a hole 201 defined in the printed circuit board 200. The posts 131 are used to position the anchor 12 to the printed circuit board 200 and the flange 132 is used to fix the location member 130 in the retention member 120. The location member 130 can be held in that position after a high temperature welding because the flange 132 is restrained between the retention member 120 and the printed circuit board 200 in the vertical direction FIG. 5 shows another embodiment of the anchor 12'. The anchor 12' also includes a retention member 120' and a location member 130'. The retention member 120' includes a hook anchor 121' and a mounting portion 122'. The mounting portion 122' is a planar board and defines a cutout to receive the location member 130'. The location member 130' in this embodiment is made of metallic material and configured with a post. In this embodiment, the whole bottom surface of the mounting portion 122' is defined as a solder surface 1230' such that can increase solder surface.

In the present invention, the electrical connector and the anchor 12 are both soldered to a top surface of the printed circuit board 200 by SMT in a same process such that can reduce the manufacturing cost. The solder surface 1230 is parallel to the top surface of the printed circuit board 200 and not restrict by structure so that can provide adequate retention force.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electronic device, comprising:
    a printed circuit board equipped with an electronic package mounted upon a top surface of the printed circuit board;
    a clip member;
    a heat sink seated upon the electronic package; and
    an anchor having:
        a mounting portion including two solder portions, the two solder portions providing two solder surfaces at a bottom surface of the mounting portion for soldering to the top surface of the printed circuit board and a protrusion portion connecting the two solder portions,
        a location member with a post received in a cutout defined on the protrusion portion and a flange received in an accommodating room defined at bottom of the protrusion portion, and
        a hook portion used to lock the clip member assembled to the heat sink,
    wherein the two solder surfaces are mounted to the top surface of the printed circuit board by a surface mount technique (SMT).

2. The electronic device as claimed in claim 1, wherein the hook portion extends in a vertical direction perpendicular to the top surface of the printed circuit board and the mounting portion extends substantially along the top surface of the printed circuit board.

3. The electronic device as claimed in claim 1, wherein the hook portion defines an opening to receive and lock the clip member.

4. The electronic device as claimed in claim 1, wherein the post has another end assembled to a hole of defined on the printed circuit board.

5. The electronic device as claimed in claim 1, wherein the clip member includes a pressing portion disposed on the heat sink and a locking portion locked by the hook portion.

6. The electronic device as claimed in claim 1, wherein the mounting portion is a planar board extending parallel to the top surface of the printed circuit board and defines a hole to receive a metallic post.

7. An anchor assembled to a printed circuit board used to hook a corresponding member, comprising:
    a retention member including:
        a mounting portion extending substantially along a top surface of the printed circuit board, the mounting portion includes two solder portions with two solder surfaces for soldering to the printed circuit board and a protrusion portion connecting the two solder portions, the protrusion portion higher than the solder portions, and
        a hook portion extending upwardly from the mounting portion; and
    a location member including:
        a post with one end connected with the retention member and another end positioned in a hole of the printed circuit board, and
        a flange disposed around the post and received below the protrusion portion,
    wherein the solder surfaces defined at a bottom surface of the mounting portion are fixed to the top surface of the printed circuit board by a surface mount technique (SMT).

8. The anchor as claimed in claim 7, wherein the hook portion defines an opening.

9. The anchor as claimed in claim 7, wherein the mounting portion defines a cutout to receive the one end of the post.

10. The anchor as claimed in claim 7, wherein the location member is held between the mounting portion and the printed circuit board.

11. An electronic device assembly comprising:
    a printed circuit board defining a surface with a hole therein;
    an electronic package mounted upon said surface beside said hole;
    a heat sink seated upon the electronic package so as to have said electronic package sandwiched between the printed circuit board and the heat sink;
    an anchor fastened upon the printed circuit board beside said electronic package, said anchor includes:
        a horizontal through opening extending through the anchor,
        a lower location member with a locating post thereon, the locating post inserted into the hole of the printed circuit board, and
        an upper retention member stacked upon the lower location member, an upper retention member having two horizontal soldering portions symmetrically located by respective sides of the locating post; and
    a clip member having a first portion removably locked to the horizontal through opening of the anchor and a second portion pressing the heat sink toward the printed circuit board,
    wherein each of the horizontal soldering portions is surface-mounted upon the printed circuit board.

12. The electronic device assembly as claimed in claim 11, wherein the two horizontal soldering portions are aligned with each other in a direction along which said horizontal through opening axially extends.

13. The electronic device assembly as claimed in claim 11, wherein both the first portion and the second portion of the clip member extend in a same direction in a top view of the electronic device assembly.

* * * * *